United States Patent [19]

Haug et al.

[11] Patent Number: 5,162,264

[45] Date of Patent: Nov. 10, 1992

[54] INTEGRATED CIRCUIT PACKAGE

[75] Inventors: Werner O. Haug, Boeblingen; Erich Klink, Schoenaich; Karl E. Kröll, Altdorf; Thomas Ludwig, Sindelfingen; Helmut Schettler, Dettenhausen; Rainer Stahl, Schönaich; Otto M. Wagner, Altdorf, all of Fed. Rep. of Germany

[73] Assignee: International Business Machines Corporation, Armonk, N.Y.

[21] Appl. No.: 696,675

[22] Filed: May 7, 1991

Related U.S. Application Data

[63] Continuation of Ser. No. 480,422, Feb. 15, 1990, Pat. No. 5,016,087.

[30] Foreign Application Priority Data

Apr. 20, 1989 [EP] European Pat. Off. ......... 89107094.8

[51] Int. Cl.$^5$ ............................................. H01L 21/60
[52] U.S. Cl. ..................................... 437/209; 437/215; 437/60; 437/51
[58] Field of Search ................. 437/209, 215, 919, 60, 437/51

[56] References Cited

U.S. PATENT DOCUMENTS

| | | | |
|---|---|---|---|
| 4,021,838 | 5/1977 | Warwick | 357/71 |
| 4,453,176 | 6/1984 | Chance et al. | 357/51 |
| 4,616,655 | 10/1986 | Weinberg et al. | 357/80 |
| 4,675,717 | 6/1987 | Herrero et al. | 357/71 |
| 4,739,389 | 4/1988 | Goedbloed | 357/75 |
| 4,866,507 | 9/1989 | Jacobs et al. | 357/75 |

FOREIGN PATENT DOCUMENTS

| | | |
|---|---|---|
| 0083405 | 11/1982 | European Pat. Off. . |
| 220500 | 5/1987 | European Pat. Off. . |
| 2529013 | 6/1983 | France . |
| 0158958 | 9/1983 | Japan ............ 357/67 |
| 0220939 | 11/1985 | Japan ............ 357/67 |
| 8503806 | 2/1985 | PCT Int'l Appl. . |
| 8602490 | 9/1985 | PCT Int'l Appl. . |

OTHER PUBLICATIONS

R. R. Tummala et al. (editors), "Microelectronics Packaging Handbook," Van Nostrand Reinhold, pp. 698–702 1989.

(List continued on next page.)

*Primary Examiner*—Brian E. Hearn
*Assistant Examiner*—Kevin Picardat
*Attorney, Agent, or Firm*—Aziz M. Ahsan

[57] ABSTRACT

Integrated circuit package comprising a power supply distribution wiring and a chip interconnection signal wiring both formed on the top surface of a passive semiconductor interconnection carrier (2) in which a power supply decoupling capacitor is implemented.

Spaced wells (4) of a first conductivity type are provided in the surface of said carrier of a second conductivity type.

The power supply distribution wiring comprises first and second conductive lines (5,6) within a first wiring level (WL1).

Said first conductive lines (5) are deposited on the surface areas of said wells (4) in an ohmic contact relationship and said second conductive lines (6) are deposited on the surface areas of said carrier (2) between said wells (4) in an ohmic contact relationship.

Said first and second conductive lines are connected to first and second terminals of the power supply, respectively, so that the junction capacitance between said wells (4) and the carrier material (2) embedding said wells forms said decoupling capacitor.

At least one active integrated circuit chip (1) is mounted and electrically connected to the passive semiconductor interconnection carrier (2).

30 Claims, 2 Drawing Sheets

OTHER PUBLICATIONS

R. O. Lussow, "Internal Capacitors and Resistors For Multilayer Ceramic Modules," IBM Technical Disclosure Bulletin, vol. 20, No. 9, pp. 3436–3437, Feb., 1978.

B. Narken, et al., "Low Capacitive Via Path Through High Dielectric Constant Material," IBM Technical Disclosure Bulletin, vol. 22, No. 12, pp. 5330–5331, May, 1980.

P. Kraynak, et al., "Wafer-Chip Assembly for Large-Scale Integration," IEEE Transactions on Electron Devices, vol. ED-15, No. 9, pp. 660–663, Sep., 1968.

R. K. Spielberger, et al., "Silicon-on-Silicon Packaging," IEEE Transactions on Components, Hybrids, and Manufacturing Technology, vol. CHMT-17, No. 2, pp. 193–196, Jun., 1984.

H. J. Levinstein, et al., "Multi-Chip Packaging Technology for VLSI-Based System," 1987 IEEE Int'l Solid State Circuits Conference, vol. 30, pp. 224–225, (Feb. 1987).

INTEGRATED CIRCUIT PACKAGE

This is a continuation of U.S. patent application Ser. No. 07/480,422, filed on Feb. 15, 1990, which has issued as U.S. Pat. No. 5,016,087, on May 14, 1991.

FIELD OF THE INVENTION

This invention relates to integrated circuit packages comprising at least one active integrated circuit chip mounted and electrically connected to a power supply distribution wiring and a chip interconnection signal wiring formed on the top surface of a semiconductor interconnection carrier in which a power supply decoupling capacitor is implemented.

BACKGROUND OF THE INVENTION

As very large scale integrated (VLSI) circuits tend to get more complex, there is a need to switch more output driver circuits and internal latches at a faster rate in order to increase their performance. This increase in the switching rate results in an increase in the amount of electrical noise associated therewith.

Various techniques have been utilized in the art to minimize the level of noise associated with the increase in the magnitude of the switching rate. One known technique for reducing the level of noise is to incorporate discrete capacitors as a decoupling capacitance between associated pins of the power supply voltage. Generally, the discrete capacitor, which is mounted at a distance from the semiconductor chip is electrically coupled thereto by a plurality of power wiring lines or large power buses. These power wiring lines typically represent long inductance paths. Moreover, as the switching rate of the current flowing in the plurality of wiring lines increases, a voltage drop develops there across. The voltage drop is viewed as unwanted power distribution noise.

One technique of minimizing the inductance path is to move the discrete capacitor as close as possible to the semiconductor chip. However, in view of either the layout of the wiring lines associated with the semiconductor chip or the physical dimensions of the discrete capacitor, the discrete capacitor cannot be positioned such that there is no voltage drop or noise. Additionally, the discrete capacitors used for this purpose are usually high-frequency, low-inductance capacitors which increase the cost associated with the use of this technique. The noise level created by the increase in the rate of current switching limits the performance and the number of simultaneously switchable VLSI circuits.

Consequently, there is a need for a technique which reduces the noise associated with the increase in the rate of current switching and which minimizes the inductance paths and the cost associated therewith.

Narken et al. "Low Capacitive Via Path Through High Dielectric Constant Material", IBM TDB Vol. 22, No. 12, pp. 5330–1 (May 1980), describes a decoupling capacitor located in a multilayer structure directly below a chip with wires extending to the dielectric material of the capacitors. The arrangement is intended to minimize the inductance of the structure.

Lussow "Internal Capacitors and Resistors for Multilayer Ceramic Modules" IBM TDB Vol. 20, No. 9, pp. 3436–7 (February 1978), describes a multilayer ceramic module with capacitors incorporated within the green sheet structure.

In these prior art chip carriers, it is a problem to provide capacitors with relatively high values located near the chips and to provide ultra-low inductance connections between the chips and the capacitors. High-performance packages will require on-module decoupling capacitors to suppress simultaneous switching noise. Such capacitors should have minimum inductance, ideally, zero inductance. For this reason EP-A 0 083 405 discloses a ceramic carrier for any number of VLSI chips, the carrier including a built-in capacitor structure. There are aligned connector lines extending in opposite directions to eliminate out magnetic flux induced by currents in the leads to the capacitor. The capacitor comprises multiple segments which are located within the body of the carrier and which are connected such that they are adapted to easy mechanical or laser deletion for altering the capacitance of the capacitor or for removing defects after fabrication.

Instead of using ceramic carriers, a packaging technique using silicon as a multi-chip carrier is disclosed by Spielberger et al., "Silicon-on-Silicon Packaging", IEEE Transactions on Components, "Hybrids and Manufacturing Technology", Vol. CHMT-7, No. 2, pp. 193–196, (June 1984). The multiple integrated circuit chips are flip-chip or face-down bonded which involves physically locating and bonding the pads of the circuit chips to corresponding pads of the wiring layers provided on the interconnection carrier. This packaging technique offers considerable advantages. Since the photoengraving technology used in the interconnection carrier and on the chips is identical, very -high packaging densities are achieved, with minimum area requirements for interconnections. Furthermore, low-cost packaging can be achieved, since the carrier utilizes conventional integrated processes, and semiconductor material defects are tolerable as there are no active devices. However, there is the option of using the carrier for active devices.

Continuing this packaging technology, the PCT application WO 86/02 490 which corresponds to U.S. Pat. No. 4,675,717) discloses integrated circuit packages comprising integrated circuit chips mounted and electrically connected to a power supply distribution wiring and a chip interconnection signal wiring formed on the surface of a semiconductor interconnection carrier in which a power supply decoupling capacitor is implemented. The silicon carrier is highly doped to render it relatively conductive. A substantially planar metallization layer is formed overlaying the top-surface of the carrier. A dielectric layer is under laying a major portion of the top surface metallization layer. This portion of the metallization layer forms one plate of the carrier-size decoupling capacitor. Additionally, a continuous metallization layer is formed on the bottom surface of the carrier. The conductive carrier itself and the bottom surface layer form the other plate of this capacitor. Whenever electrical connection is between a pad on the chip and the upper surface layer, the carrier-size capacitor is also connected to the chip in low-inductance fashion for effective decoupling.

These presently known and available packages have been developed mainly for bipolar chip applications. In the meantime, industry has switched from bipolar to CMOS technology on a large scale. CMOS technology offers new possibilities, that means, very high density, low power consumption, and integratability of full processor units on one chip. The available packages are optimized for multi-chip processor units for high-power consumption and high-performance bipolar chips. These packages have to support high DC-currents on power lines and even on signal lines.

The CMOS VLSI technique puts new requirements on the package. The CMOS VLSI chips require very high current surges on the power supplies. Therefore, a new and CMOS optimized package concept is required The invention as claimed overcomes the problems associated with the requirement of reducing the noise caused by the increase in the rate of current switching. The invention provides an improved electronic package in which semiconductor chips are mounted on a semiconductor interconnection carrier and in which decoupling capacitors are an integrated part of the power distribution system.

The chip carrier proposed is specially designed for fast and high-density CMOS applications. In order to support high-speed CMOS chips, there is a decoupling capacitor integrated in the carrier. The wiring on the chip carrier is laid out for lowest capacity and minimized impedance.

SUMMARY OF THE INVENTION

In one aspect this invention is directed to a process for making an integrated circuit package, comprising, on a passive semiconductor interconnection carrier, wherein the interconnection carrier being of a first conductivity type, forming at least one well of an opposite second conductivity type on the surface of the interconnection carrier, forming a power supply distribution wiring comprising first and second conductive lines, wherein the first conductive line being deposited in an ohmic contact relationship on at least a portion of the well, wherein the second conductive line being deposited in an ohmic contact relationship on the surface of the interconnection carrier, and wherein the first and the second conductive lines being connected to first and second terminals of the power supply, so that a junction capacitance is formed between the well and the interconnection carrier thereby forming a decoupling capacitor.

In another aspect this invention is directed to a process for making an integrated circuit package, comprising, on a passive semiconductor interconnection carrier, wherein the interconnection carrier being of a first conductivity type, forming at least one stripe of a dielectric layer on the surface of the interconnection carrier, forming a power supply distribution wiring comprising first and second conductive lines, wherein the first conductive line being deposited on at least a portion of the stripe, wherein the second conductive line being deposited in an ohmic contact relationship on the surface of the interconnection carrier, and wherein the first and the second conductive lines being connected to first and second terminals of the power supply, so that a decoupling capacitor is formed at the junction of the strip and the interconnection carrier.

An integrated circuit package, is described which comprises, a passive semiconductor interconnection carrier, the interconnection carrier being of a first conductivity type, at least one well of an opposite second conductivity type being provided in the surface of the interconnection carrier, a power supply distribution wiring comprising first and second conductive lines, the first conductive line being deposited in an ohmic contact relationship on at least a portion of the well, the second conductive line being deposited in an ohmic contact relationship on the surface of the interconnection carrier, and the first and the second conductive lines being connected to first and second terminals of the power supply, so that a junction capacitance is formed between the well and the interconnection carrier thereby forming a decoupling capacitor.

An integrated circuit package, which comprises, a passive semiconductor interconnection carrier, the interconnection carrier being of a first conductivity type, at least one stripe of a dielectric layer being provided on the surface of the interconnection carrier, a power supply distribution wiring comprising first and second conductive lines, the first conductive line being deposited on at least a portion of the stripe, the second conductive line being deposited in an ohmic contact relationship on the surface of the interconnection carrier, and the first and the second conductive line being connected to first and second terminal of the power supply, so that a decoupling capacitor is formed at the junction of the stripe and the interconnection carrier.

An integrated circuit package as described in this section, wherein additional wells are arranged parallel to each other.

The integrated circuit package as described in this section, wherein the first and the second conductive lines are arranged in a comblike fashion.

The integrated circuit package as discussed in this section, wherein a portion of the second conductive line extends over an adjacent well, but is separated from the surface of the well by a dielectric interlayer.

The integrated circuit package as described in this section, wherein a portion of the first conductive line extends over the interconnection carrier but is separated from the surface of the interconnection carrier by a dielectric interlayer.

The integrated circuit package as described in this section, wherein the power supply further comprises a second wiring level having third and fourth conductive lines, the third conductive line is electrically connected to the first conductive line, and the fourth conductive line is electrically connected to the second conductive line.

The integrated circuit package as described in this section, wherein the third and fourth conductive lines are parallel to each other.

The integrated circuit package as described in this section, wherein the third and fourth conductive lines are arranged orthogonal to the first and the second conductive lines.

The integrated circuit package as described in this section, further comprising at least one additional wiring level.

The integrated circuit package as described in this section, wherein at least two wiring lines are parallel to each other at the additional wiring level.

The integrated circuit package as described in this section, wherein each additional wiring level is separated from the previous wiring level by an insulating layer. .

The integrated circuit package as discussed in this section, wherein at least one wiring line at the additional wiring level is orthogonal to at least one wiring line at the previous wiring level.

The integrated circuit package as described in this section, wherein at least one chip is connected to the interconnection carrier by at least one solder bump.

The integrated circuit package as described in this section, wherein additional stripes are arranged parallel to each other.

The integrated circuit package as described in this section, wherein a portion of the second conductive line extends over an adjacent stripe, but is separated from the surface of the stripe by a dielectric interlayer.

The integrated circuit package as described in this section, wherein at least one active integrated circuit chip is mounted and electrically connected to the passive semiconductor interconnection carrier.

The integrated circuit package as described in this section, wherein the grid structure of the last two wiring levels is adapted to the power pad grid structure of the chip.

BRIEF DESCRIPTION OF THE DRAWINGS

The features of the invention believed to be novel and the elements characteristic of the invention are set forth with particularity in the appended claims. The invention itself, however, both as to organization and method of operation, may best be understood by reference to the detailed description which follows taken in conjunction with the accompanying drawings in which:

DETAILED DESCRIPTION OF THE INVENTION

Figure 1:
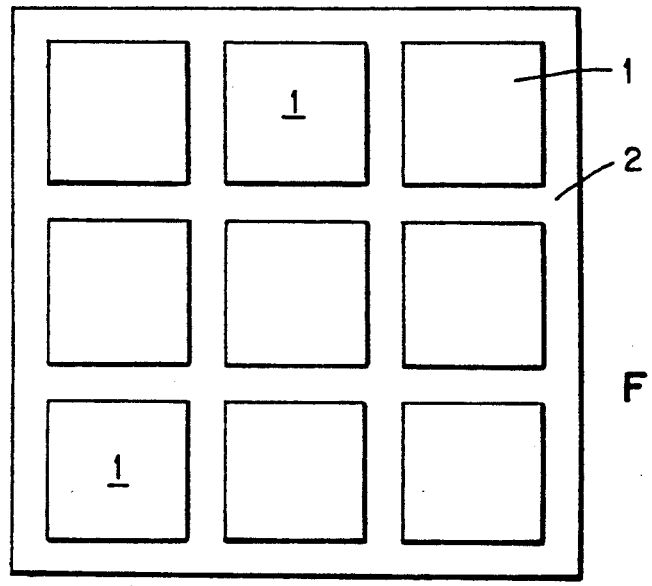
FIG. 1 shows a simplified plan view of an integrated circuit package.

The schematic plan view of FIG. 1 relates to an integrated circuit package comprising a passive semiconductor interconnection carrier 2, on the top-surface of which nine active circuit chips 1, are arranged, for instance.

Figure 2:
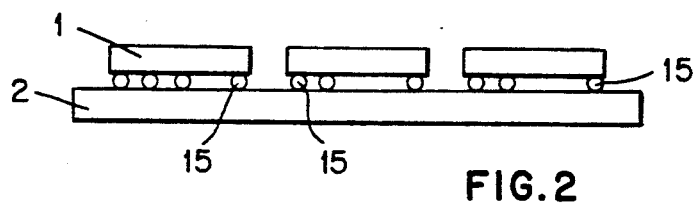
FIG. 2 shows a sectional view of the package of FIG. 1.

As can be seen from the schematic cross-section of FIG. 2, the flip-chip or face down bonding concept is used to connect the chips 1, to the wiring (not shown) arranged on the top surface of the interconnection carrier 2. This concept involves physically locating and bonding the pads of the active circuit chips 1, to the corresponding pads in the wiring on the interconnection carrier 2. To form the resistance bond and to separate the chip 1, and the interconnection carrier 2, a metallic bump 15, is formed on the circuit chip 1, or on the interconnection carrier 2, or on both. There are, of course, a variety of compatible metal systems which serve this purpose, each having relative advantages over the others. Systems used are ultrasonic bonding, thermocompression bonding, and solder reflow bonding.

The passive interconnection carrier 2 includes a decoupling capacitor system which, according to the invention, is optimized with respect to noise problems induced by high density and high switching rates of the circuit chips 1.

The arrangement of the decoupling capacitors, the necessary power supply distribution wiring, and the chip interconnection signal wiring is described in preferred detail below with reference to FIGS. 3 through 7.

Figure 4:
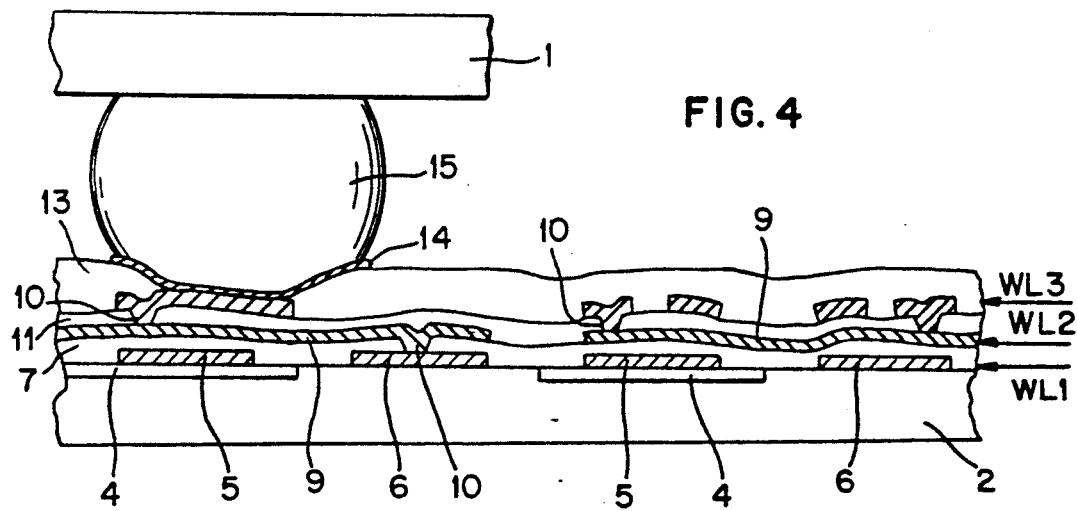
FIG. 4 shows a sectional view of an embodiment similar to that of FIG. 3.
Figure 3:
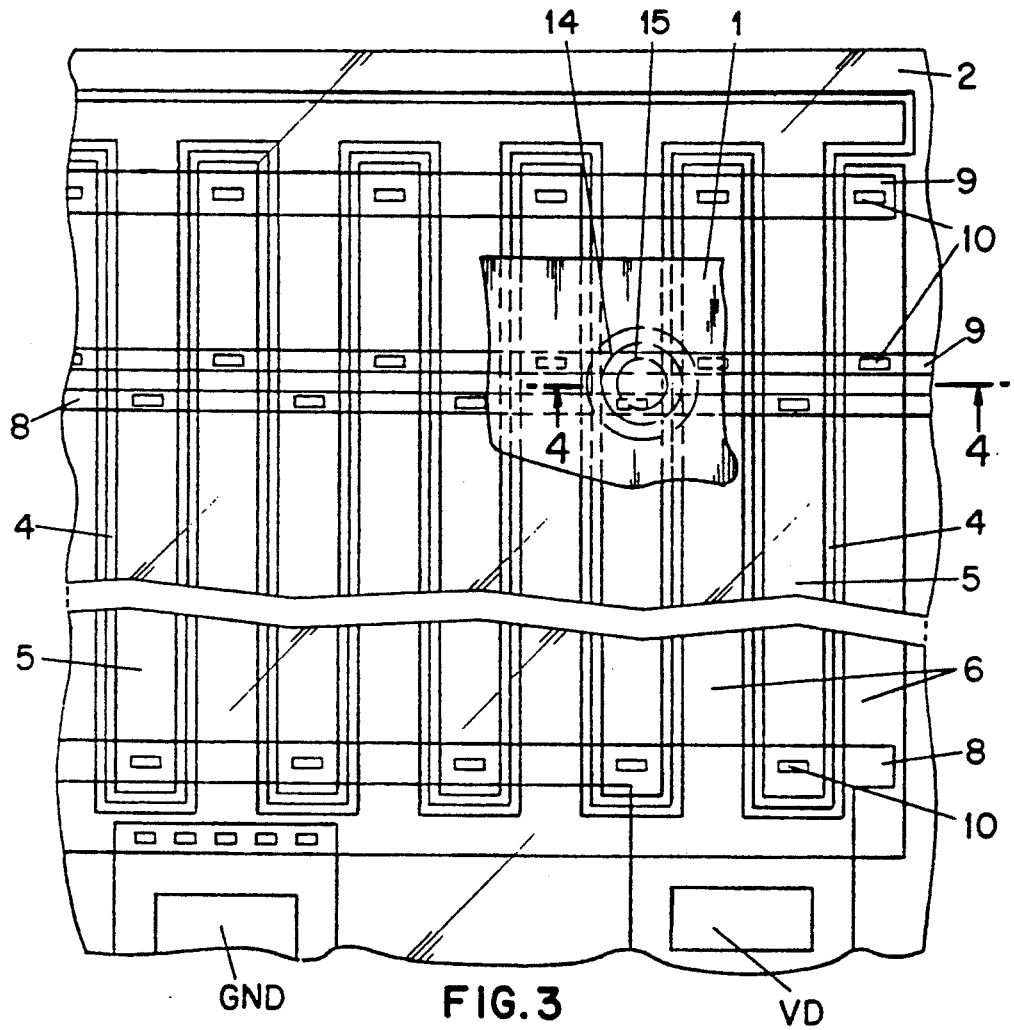
FIG. 3 shows a simplified plan view of a section of a first embodiment in accordance with the invention.

The schematic plan view of an integrated circuit package according to the invention shown in FIG. 3, and the cross-section along line 4—4 of this package shown in a similar arrangement in FIG. 4, include a section of a semiconductor interconnection carrier 2, which preferably consists of monocrystalline silicon.

This carrier 2, is highly P+ doped. In the surface of carrier 2, there are N+ wells which are preferably produced by implantation or diffusion of appropriate doping material. In the preferred embodiment, these wells consists of regularly arranged parallel stripes 4, distributed across the carrier 2.

Within a first wiring level WL1, first conductive lines 5 are directly arranged on the surface of that stripes 4. These, preferably metallic, lines 5 form low-ohmic contacts to the stripes 4. Additionally, there are second conductive lines 6 deposited on the surface areas or the carrier 2 between the stripes 4 and the first lines 5. These lines 5 are in low-ohmic contact with the P+ carrier material.

The first and second lines 5 and 6 are arranged in a comblike fashion. A first insulating layer 7 is deposited on the first wiring level WL1. On a second wiring level WL2, third and fourth conductive lines 8 and 9 are deposited on-the first insulating layer 7. The third and fourth lines 8 and 9 extend orthogonally to the lines 5 and 6 of the first wiring level WL1. The third lines 8 are electrically connected to the first lines 5, whereas the fourth lines 9 are electrically connected to the second lines 6. The corresponding electrical connections are made by conductive vias 10 passing through the first isolating layer 7. A third line 8 is connected to a power supply bond pad supplying a positive voltage VD and the fourth line 9 is connected to a power supply bond pad supplying ground potential GND. This leads to the junction between the N+ stripes 4 and P+ carrier 2 being biased in a backward direction. The resultant depletion layer capacitance forms the decoupling capacitor to be implemented for the power supply of the active chips 1. The arrangement of the chips on the carrier 2 and the electrical connection to the wiring levels of this carrier are effected as follows.

A second insulating layer 11 is deposited on the second wiring level WL2 including the third and fourth conductive lines 8 and 9. A third wiring level WL3, comprising the signal interconnection and signal wiring for the active chips, is deposited on the second insulating layer 11. Again, electrical connection vias 10 between the signal wiring and the second wiring level WL2 are provided where necessary for the active chip function and power supply. A third insulating layer 13 covers the third wiring level WL3 on which ball limiting pads 14 are arranged. The ball limiting pads 14, which are connected by further conductive vias 10 to lines of the third wiring level WL3, are provided with receive solder bumps 15. The solder bumps 15 form the electrical connection between the integrated circuits of the active chips 1 and the chip interconnection and signal wiring and the power supply distribution wiring arranged on the three wiring levels.

Figure 5:
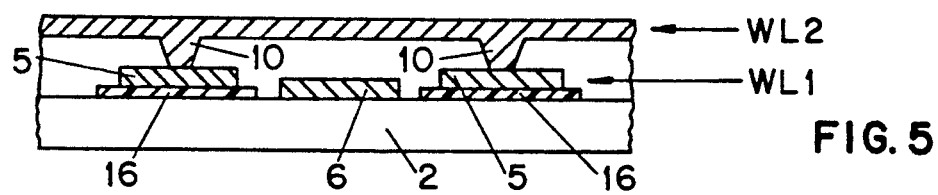
FIG. 5 shows a simplified sectional view of a second embodiment in accordance with the invention.
Figure 6:
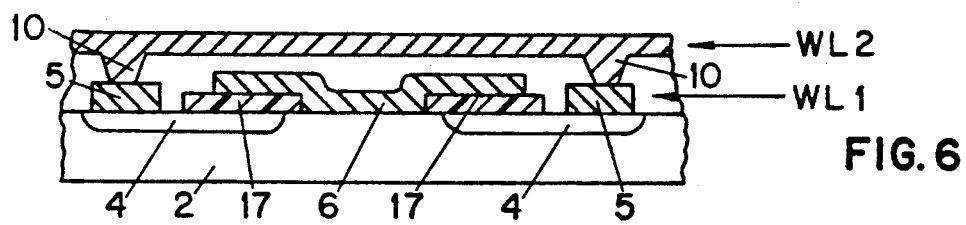
FIG. 6 shows a simplified sectional view of a third embodiment in accordance with the invention.
Figure 7:
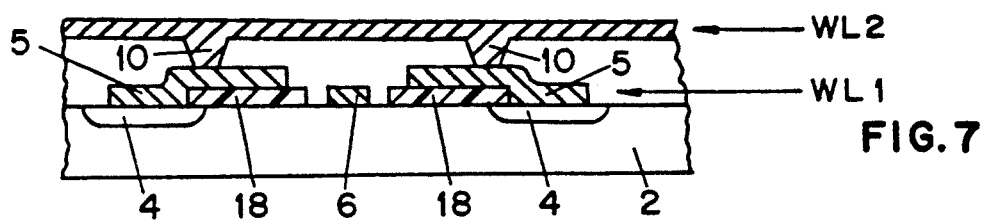
FIG. 7 shows a simplified sectional view of a fourth embodiment in accordance with the invention.

The embodiments shown in the schematic of FIGS. 5, 6 and 7 do not differ in principle from the embodiment shown in FIGS. 3 and 4. Therefore, only the portion containing the differences between both embodiments is depicted. Differences merely exist in the realization of the decoupling capacitor. In the embodiment of FIGS. 3 and 4 the decoupling capacitors are formed by the depletion layer at the junction-between the stripes 4 and the carrier material, the embodiment of FIG. 5 uses a purely dielectric capacitor, and the embodiments of FIGS. 6 and 7 a combined junction/dielectric capacitor.

The embodiment of FIG. 5 again comprises the highly doped passive semiconductor interconnection carrier 2. The surface of the carrier 2 is provided with spaced stripes 16 of a dielectric interlayer. The first conductive lines 5 of the first wiring level WL1 are deposited on the surface of these stripes 16, forming the first plate of the dielectric capacitor. The second conductive lines 6 are in ohmic contact with the surface of the carrier 2 between the stripes 16, forming along with the highly doped carrier material the second plate of the capacitor. The second wiring level WL2, which is electrically connected to the first wiring level WL1 through vias 10, and the first wiring level WL1 form the power supply distribution wiring. The arrangement of the chips and the third wiring level WL3 correspond to the embodiment of FIGS. 3 and 4 and are not shown in FIG. 5.

In the embodiment of FIG. 6, N+ stripes 4 are again provided within the surface of the P+ carrier 2. The first and second conductive lines 5 and 6 of the first wiring level WL1 are in direct ohmic contact with the respective surfaces of the stripes 4 and the carrier 2 between the stripes 4. The technical significance is inherent in the additional feature providing for the second lines 6 to extend partly across the adjacent stripe areas but to be separated from the surfaces of the stripes by additional stripes 17 of a dielectric interlayer.

A similar approach is implemented in the embodiment of FIG. 7, wherein the first lines 5 extend partly across adjacent carrier areas, being separated from the surface of the carrier 2 by additional stripes 18 of a dielectric interlayer.

The common aspect of the embodiments according to FIGS. 6 and 7 consists in the realization of the decoupling capacitor as a parallel connection of a junction capacitor and a dielectric capacitor. That means, the capacitances of both capacitors are added to yield a high value.

An important feature of the subject invention is the possibility of having an integrated circuit package with a passive semiconductor carrier combining active integrated circuit chips, the power supply of which including the necessary decoupling capacitors is optimized by adapting the power distribution wiring and the decoupling capacitors structure to the power pad grid of the active chips.

The most important feature is that directly underneath each chip there is a power supply decoupling capacitor. The extremely close connection between chip and capacitor has almost no inductivity in series. Therefore, the capacitor serves as a decoupling capacitor for very high frequencies. Additional advantages are, that the second wiring level WL2 normally contains only a few power lines and underpaths for the third wiring level WL3. In summary this means that the second wiring level WL2 has a very low wiring density. This is very advantageous with respect to a very low capacitance of the third wiring level WL3 and high process yield resulting from reduced inter-level shorts.

Additional advantages are, that the first wiring level WL1 is directly connected to the silicon as described by FIG. 4. No isolation between silicon and metal layer is needed. Therefore, the interconnecting vias between the two is saved. The interface between metal layer and the silicon is insensitive to defects. This is especially true for the arrangement of FIG. 4 and some what less effective for the arrangements of FIG. 5 through 7.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A process for making an integrated circuit package, comprising,
   on a passive semiconductor interconnection carrier, wherein said interconnection carrier being of a first conductivity type, forming at least one well of an opposite second conductivity type on the surface of said interconnection carrier,
   forming a power supply distribution wiring comprising first and second conductive lines,
   wherein said first conductive line being deposited in an ohmic contact relationship on at least a portion of said well,
   wherein said second conductive line being deposited in an ohmic contact relationship on the surface of said interconnection carrier, and
   wherein said first and said second conductive lines being connected to first and second terminals of said power supply, so that a junction capacitance is formed between said well and said interconnection carrier thereby forming a decoupling capacitor.

2. The process of claim 1, wherein additional wells are formed parallel to each other.

3. The process of claim 1, wherein said first and said second conductive lines are formed in a comblike fashion.

4. The process of claim 1, wherein a portion of said second conductive line extends over an adjacent well, but is separated from the surface of said well by a dielectric interlayer.

5. The process of claim 1, wherein a portion of said first conductive line extends over said interconnection carrier but is separated from the surface of said interconnection carrier by a dielectric interlayer.

6. The process of claim 1 wherein said power supply further comprises a second wiring level having third and fourth conductive lines, wherein said third conductive line is electrically connected to said first conductive line, and wherein said fourth conductive line is electrically connected to said second conductive line.

7. The process of claim 6, wherein said third and fourth conductive lines are formed parallel to each other.

8. The process of claim 6, wherein said third and fourth conductive lines are formed orthogonal to said first and said second conductive lines.

9. The process of claim 1, further comprising at least one additional wiring level.

10. The process of claim 9, wherein at least two wiring lines are formed parallel to each other at said additional wiring level.

11. The process of claim 9, wherein said additional wiring level formed is separated from the previous wiring level by an insulating layer.

12. The process of claim 9, wherein at least one wiring line at said additional wiring level is orthogonal to at least one wiring line at the previous wiring level.

13. The process of claim 1, wherein at least one chip is connected to said interconnection carrier by at least one solder bump.

14. The process of claim 1, wherein at least one active integrated circuit chip is mounted and electrically connected to said passive semiconductor interconnection carrier.

15. The process of claim 14, wherein the grid structure of the last two wiring levels is adapted to the power pad grid structure of said chip.

16. A process for making an integrated circuit package, comprising,
on a passive semiconductor interconnection carrier, wherein said interconnection carrier being of a first conductivity type, forming at least one stripe of a dielectric layer on the surface of said interconnection carrier,
forming a power supply distribution wiring comprising first and second conductive lines,
wherein said first conductive line being deposited on at least a portion of said stripe,
wherein said second conductive line being deposited in an ohmic contact relationship on the surface of said interconnection carrier, and
wherein said first and said second conductive lines being connected to first and second terminals of said power supply, so that a decoupling capacitor is formed at the junction of said stripe and said interconnection carrier.

17. The process of claim 16, wherein additional stripes are formed parallel to each other.

18. The process of claim 16, wherein said first and said second conductive lines are formed in a comblike fashion.

19. The process of claim 16, wherein a portion of said second conductive line extends over an adjacent stripe, but is separated from the surface of said stripe by a dielectric interlayer.

20. The process of claim 16, wherein a portion of said first conductive line extends over said interconnection carrier but is separated from the surface of said interconnection carrier by a dielectric interlayer.

21. The process of claim 16, wherein said power supply further comprises a second wiring level having third and fourth conductive lines, wherein said third conductive line is electrically connected to said first conductive line, and wherein said fourth conductive line is electrically connected to said second conductive line.

22. The process of claim 21, wherein said third and fourth conductive lines are formed parallel to each other.

23. The process of claim 21, wherein said third and fourth conductive lines are formed orthogonal to said first and said second conductive lines.

24. The process of claim 16, further comprising at least one additional wiring level.

25. The process of claim 24, wherein at least two wiring lines are formed parallel to each other at said additional wiring level.

26. The process of claim 24, wherein each additional wiring level formed is separated from the previous wiring level by an insulating layer.

27. The process of claim 24, wherein, at least one wiring line at said additional wiring level is orthogonal to at least one wiring line at the previous wiring level.

28. The process of claim 16, wherein at least one chip is connected to said interconnection carrier by at least one solder bump.

29. The process of claim 16, wherein, at least one active integrated circuit chip is mounted and electrically connected to said passive semiconductor interconnection carrier.

30. The process of claim 29, wherein the grid structure of the last two wiring levels is adapted to the power pad grid structure of said chip.

* * * * *